United States Patent

Krekels et al.

[11] Patent Number: 6,081,125
[45] Date of Patent: Jun. 27, 2000

[54] NETWORK ANALYZER

[75] Inventors: Hans-Gerd Krekels; Burkhard Schiek, both of Bochum; Olaf Ostwald, Munich, all of Germany

[73] Assignee: Rohde & Schwarz GmbH & Co. KG, Munich, Germany

[21] Appl. No.: 08/580,533

[22] Filed: Dec. 29, 1995

Related U.S. Application Data

[63] Continuation of application No. 08/277,513, Jul. 19, 1994, abandoned.

[30]     Foreign Application Priority Data

Aug. 30, 1993 [DE]  Germany ................................ 43 29 132
Jan. 15, 1994 [DE]  Germany ................................ 44 01 068

[51] Int. Cl.$^7$ .................................................. G01R 27/28
[52] U.S. Cl. ............................................ 324/601; 324/638
[58] Field of Search ..................... 333/17.1, 18; 324/601, 324/638, 639, 642

[56]               References Cited

U.S. PATENT DOCUMENTS

| | | |
|---|---|---|
| 3,319,194 | 5/1967 | Adam . |
| 4,780,661 | 10/1988 | Bolomey ................................. 324/601 |
| 4,982,164 | 1/1991 | Schiek et al. . |

FOREIGN PATENT DOCUMENTS

| | | | |
|---|---|---|---|
| 1298690 | 3/1987 | U.S.S.R. | ................................. 324/601 |
| 1345140 | 10/1987 | U.S.S.R. | ................................. 324/601 |

OTHER PUBLICATIONS

Engen: "The Multistate Two Port: An Alternative Transfer Standard"—ARFTG Digest—Spring 1993.

ATN LP1—Load Pull System—Product Brochure 5091–8311E dated Aug. 1993.

Rabinovich: "An Instrument for Calibrating and Tuning Waveguide Reflectometers"—Telecomms & Radio Engineering—Sep. 73.

IEEE Transactions on Microwave Theory & Techniques, "A Generalized Theory and New Calibration Procedures for Network Analyzer Self–Calibration", H. J. Eul et al., vol. 39, No. 4, Apr. 1991, pp. 724–731.

IEEE Transactions on Instrumentation & Measurement, "Reducing the Number of Calibration Standards for Network Analyzer Calibration", H. J. Eul et al., vol. 40, No. 4, Apr. 1991.

*Primary Examiner*—Josie Ballato
*Assistant Examiner*—Jose M. Solis
*Attorney, Agent, or Firm*—Hill & Simpson

[57]               ABSTRACT

In a network analyzer having one or two test ports each of which is connected via fourports to measuring points the measured values of which are analyzed in an evaluation means that includes a memory for storing system errors which have been determined during a calibration operation and must be taken into account for the object measurement, there is provided a calibration twoport between at least one of said test ports and said fourport of the associated measuring points, said calibration twoport being adapted to be switched from a basic state to two further switching states, and said calibration twoport differs in one of said further switching states from the basic switching state at least in transmission and in the other one of said further switching states differs at least in reflection from the basic switching state.

4 Claims, 6 Drawing Sheets

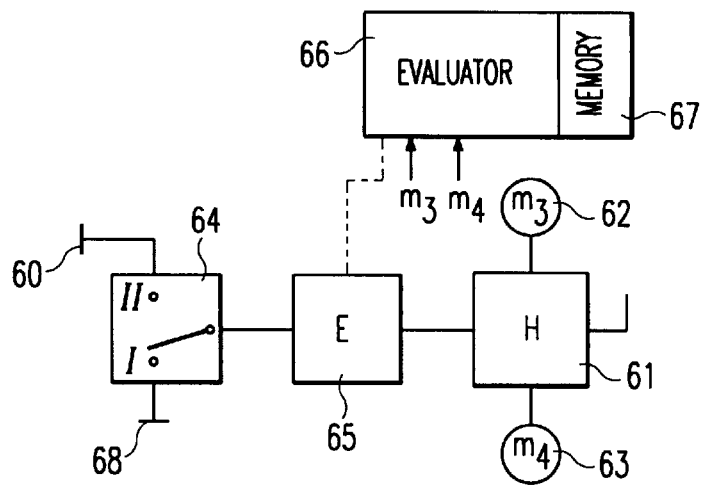
Fig. 12
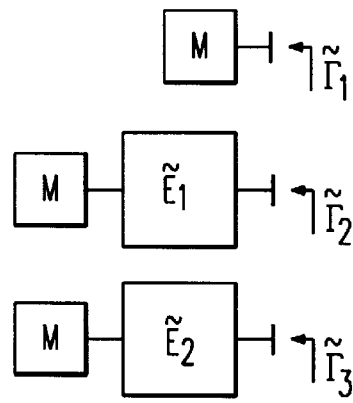
Fig. 13
Fig. 14a
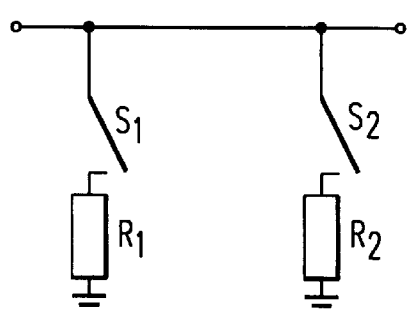
Fig. 14b
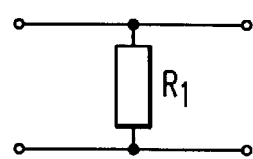
Fig. 14c
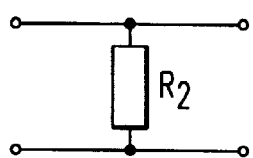

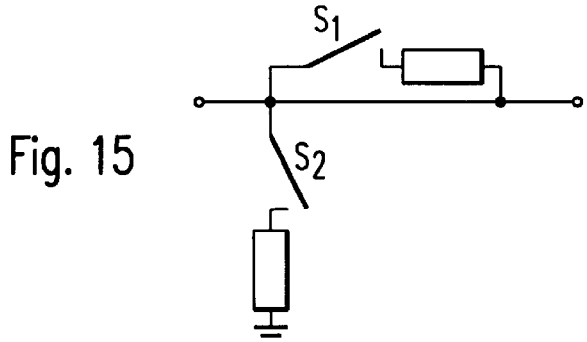
Fig. 15
Fig. 16a
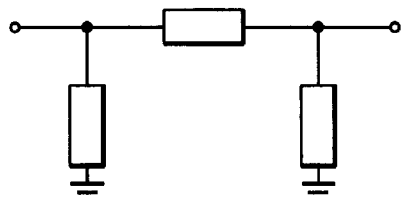
Fig. 16b
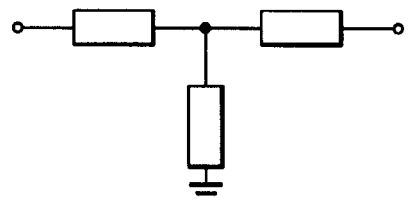
Fig. 17a
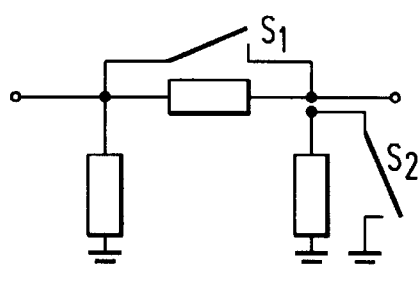
Fig. 17b
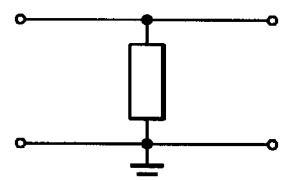
Fig. 17c
Fig. 17d
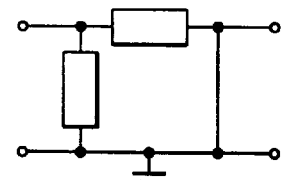

NETWORK ANALYZER

This is a continuation, of application Ser. No. 08/277,513, filed Jul. 19, 1994 now abandoned.

BACKGROUND OF THE INVENTION

1. Field of the Invention

This invention is directed to a network analyzer having one or two test ports, and a method of calibrating such a network analyzer.

2. Description of the Prior Art

In the field of radio-frequency engineering, network analyzers are used to measure scattering parameters by means of which components or networks are described. There exist network analyzers having two test ports each of which is in most cases linked to two measuring points so that four measured values are respectively obtained from a test object linked between the two test ports. A network analyzer of this type is described, for instance, in U.S. Pat. No. 4,982,164. There are also so-called unidirectional network analyzers which also comprise two test ports one of which is linked to two measuring points while the other one is linked to only one measuring point. Finally, there are also network analyzers which operate as reflectometers and which include only a single test port linked to two measuring points.

All of these network analyzers need to be calibrated prior to the actual testing of objects. To this end there are various possibilities which have been described for example by EUL, H.-J., SHIEK, B., A generalized Theory and New Calibration Procedures for Network Analyzer Self-Calibration, IEEE Trans. on Microwave Theory and Techniques, vol. MTT-39, April 1991, pp.724–731, or EUL, B.-J., SHIEK, B., Reducing the Number of Calibration Standards for Network Analyzer Calibration, IEEE Trans. on Instrumentation and Measurement, vol. MTT-40, August 1991, pp.732–735 or, respectively, in German Patent Specification 3,912,795 or U.S. Pat. No. 4,982,164. A particularly simple calibration method of the specified kind requires only three calibration standards which can readily be realized (U.S. Pat. No. 4,982,164, hereby incorporated by reference).

With the so-called TMS or TMR calibration the test ports are initially through-connected (Through), then a calibration is performed with an attenuator which is linked between the test ports and matched to be reflection-free (Match), and finally a calibration is made with a short of the two test ports (short Circuit) or with a reflection termination (Reflection). With the so-called LMS technique, a line (Line) is initially linked between the test ports as a first calibration standard, and calibration is then continued with an attenuator and a short.

During calibration the transmission and reflection parameters of these calibration standards are measured and error parameters are determined therefrom which are then stored in a memory of the evaluation means of the network analyzer and will be taken into account for error correction in the subsequent object measurement.

It is not possible, however, to take into account any variations of the electrical properties due to temperature fluctuations or the like which occur immediately after calibration so that these variations are directly introduced as errors into the measuring results. It is the demand for accuracy made by the user of such a network analyzer in respect of the test results which determines the time interval between the calibration operations. This interval may be one or two days or may only be in the range of a few hours. In some cases the calibration efforts including the connection of the discrete calibration standards to the test ports are quite considerable. In the field of industrial measurement engineering a repeated calibration is frequently quite difficult and incurs high costs because sometimes the running production must be stopped or the analyzer setup must even be removed.

SUMMARY OF THE INVENTION

It is therefore the objective of the present invention to provide a network analyzer in which such calibration is performed possibly automatically in the apparatus itself.

Based on a network analyzer having one or two test ports, the specified objective is achieved by the features of the independent claims, and advantageous further developments of such a network analyzer and of a particularly simple method of calibrating such network analyzers will be apparent from the subclaims.

In a network analyzer according to the invention, a calibration twoport adapted to be switched between two or three switching modes is disposed directly between the test port and the fourport linked to the test points, said calibration twoport being implemented in calibration line technique from attenuators and r.f. switches of very high reproducibility, for instance in accordance with U.S. Pat. No. 3,319,194 or German Patent Specification 2,637,084. This calibration twoport is automatically switched between its different switching modes under control by the evaluation means of the network analyzer, so that the entire calibration process runs fully automatically. Under certain circumstances it may only be required that the test ports must be interconnected during such an automatic calibration process, which may easily be done by the user. The determination of the transmission and/or reflection parameters in the various switching positions of the calibration twoport is preferentially effected by one of the above-mentioned known calibration methods. Due to the high stability of the calibration twoport, which is built in the known calibration line technique, such a basic calibration of the calibration twoport will be required only, for example, at regular intervals of one year, so that the successive turning-on of known calibration standards and obtaining of corresponding error parameters is required only at widely spaced time intervals while in the meantime calibration is effected automatically by the apparatus itself. When the scattering parameters of the calibration twoport are known such basic calibration may be omitted completely. U.S. Pat. No. 3,319,194, is hereby incorporated by reference.

With the calibration method of the present invention, only the changes in the switching states of the calibration twoport need to be known while the absolute values thereof need not be known; this has to be seen as the special advantage of the instant invention.

It is preferred that the calibration twoport with its two or three different switching states is composed of attenuators in π- or T-connection and of associated electromechanically controlled switches. To realize the invention it is therefore only necessary to dispose a known calibration line between test port and measuring points of the network analyzer and then to provide for control via the electromechanical control means of the calibration switches in the sense of the inventive calibration method via the evaluation means of the network analyzer, said evaluation means being programmed correspondingly, so that the user calibration is effected fully automatically.

The calibration twoport which is designed like a calibration line may either be directly integrated in the network analyzer or, if there is insufficient space, such calibration twoport may also be incorporated in a separate housing which as an auxiliary device is fastened by screws to the test ports of the actual network analyzer and to which then the actual test ports are provided which offer external access by the user. In such a case it is only necessary to establish a corresponding connection between the control means of the calibration twoport and the evaluation means of the network analyzer which is provided with a memory, and it is thereby possible in a simple way to retrofit an existing network analyzer with such an automatic calibration.

BRIEF DESCRIPTION OF THE DRAWINGS

Other objects, features and advantages of the invention, its organization, construction and operation will be best understood from the following detailed description taken in conjunction with the accompanying drawings.

FIG. 12 is a block diagram depicting the use of the present invention with a reflectometer;

FIG. 13 is a block diagram depicting all three calibration line positions of the FIG. 12 block diagram;

FIGS. 14a–14c depict three calibration network;

FIG. 15 depicts another calibration network;

FIGS. 16a–16b depict a further calibration network;

FIGS. 17a–17d depict a switchable calibration network;

DESCRIPTION OF THE PREFERRED EMBODIMENTS

Figure 1:
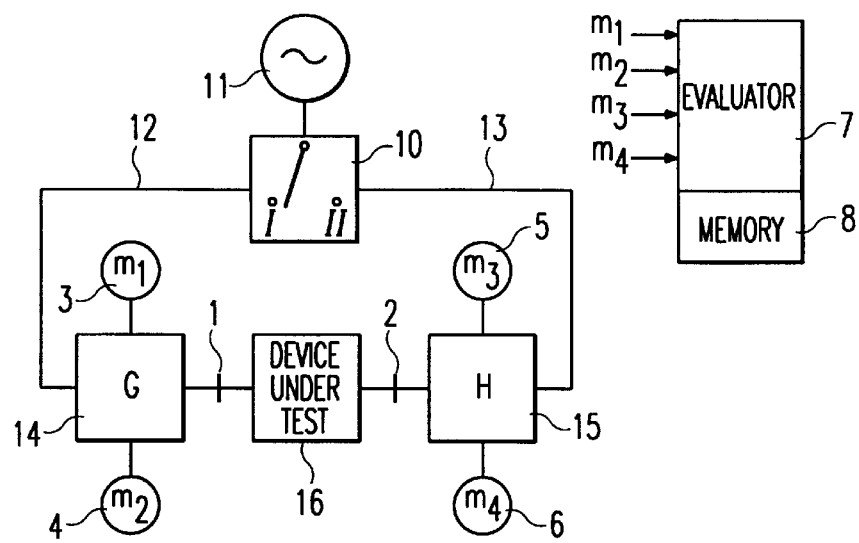
FIG. 1 is a block diagram of a prior art network analyzer.

FIG. 1 shows the basic circuit diagram of a network analyzer including two test ports 1, 2 as described, for example, in U.S. Pat. No. 4,982,164. Two separate measuring branches 12 and 13 are fed through a threeport 10 such as a reversing switch from an RF generator 1 which is frequency-variable within a predetermined frequency range. The two alternatingly connected measuring branches 12 and 13 lead to fourports 14 and 15 which are configured as measuring bridges or directional couplers and to which detectors or measuring points 3, 4 and 5, 6 are respectively connected by means of which voltage may be measured by magnitude and phase. These measuring points may be mismatched. To said fourports 14, 15 the actual test ports 1, 2 are connected between which a device under test (DUT) 16 may be linked. It is thus possible through the measuring points 3, 4 and 5, 6 to measure at the input and the output of an interlinked DUT 16 the respective complex reflection factors and complex transmission factors both in forward and reverse directions. The four measured values $m_1$ to $m_4$ from the measuring points 3, 4 and 5, 6 are evaluated in evaluating means 7; said evaluating means has a memory 8 cooperating therewith in which the system errors are stored which are obtained during a calibration operation and must be taken into account for object measurement.

Figure 2:
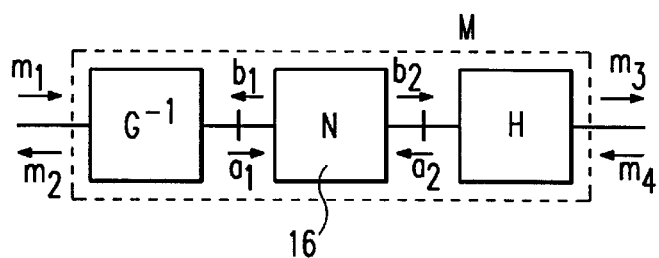
FIG. 2 illustrates algebraic relations in the FIG. 1 network analyzer.

FIG. 2 illustrates the algebraic relation between the measured values m1, m2 and m3, m4 measured by means of the measuring points 3, 4 and 5, 6, respectively, and the so-called error twoports G and H and a device under test N disposed between the two test ports 1, 2. Accordingly, the measured-value matrix M is given by $$M = G^{-1} N H \qquad (2).$$

The measured-value matrix M is obtained from the measured values $m_1$ to $m_4$ in position I of the reversing switch 10 and from the measured values $m_{1'}$ to $m_{4'}$ in position II as follows:

$$M = \begin{pmatrix} m_1 & m_1' \\ m_2 & m_2' \end{pmatrix} \begin{pmatrix} m_3 & m_3' \\ m_4 & m_4' \end{pmatrix} \qquad (3)$$

The two matrices G and H contain the error parameters for describing the two error twoports G and H, and the DUT 16 is expressed by the transmission matrix N as follows:

$$N = \frac{1}{S_{21}} \begin{pmatrix} -\det(S) & S_{11} \\ -S_{22} & 1 \end{pmatrix} \qquad (4)$$

in which $Si_{11}$ $S_{22}$ are the complex reflection factors and $S_{12}$ and $S_{21}$ are the complex transmission factors in forward and reverse directions, respectively.

Figure 3:
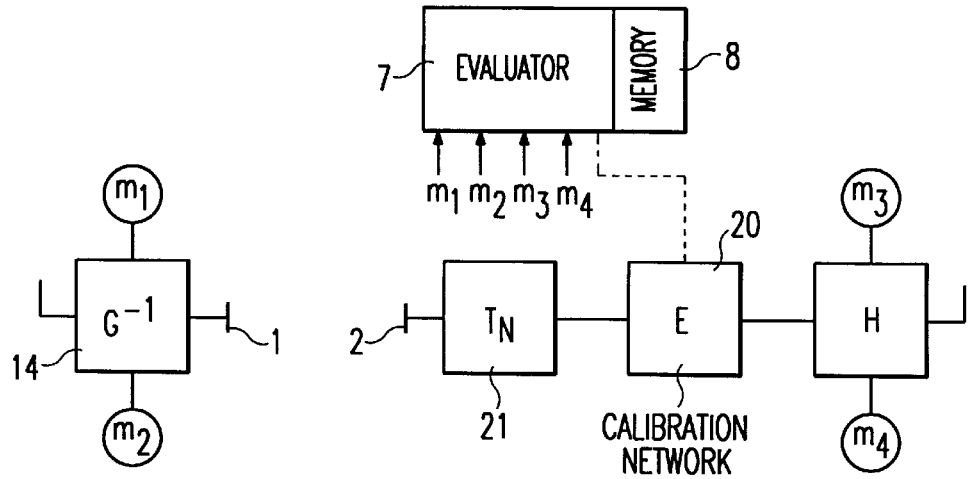
FIG. 3 is a block diagram of a network analyzer according to the present invention.

FIG. 3 illustrates such a network analyzer according to FIG. 1 which is supplemented by a calibration network 20 designed as a twoport and disposed between the one test port 2 and the associated fourport 15. The link between said calibration network 20 and the test port 2 is characterized by a schematically illustrated transmission network 21. The calibration twoport 20 may be switched from a basic state, in which it may exhibit arbitrary transmission other than zero but may exhibit arbitrary reflection, to two further states, wherein in one of said further states other than the basic state it deviates from the basic state at least as to transmission while in the other one it deviates therefrom at least as to reflection. In the basic state the calibration twoport preferentially exhibits a transmission of the magnitude 1, i.e. the properties of an ideal line or an immediate direct through-connection (Through-connection). The basic state is defined by the transmission matrix $E_0$, while the other two switching states of the calibration network 20, which differ from said basic state, are described by the matrix $E_0 \cdot E_1$ and $E_0 \cdot E_2$, respectively. The calibration network 20 is adapted to be automatically switched between these three states via the evaluation means 7 of the network analyzer. For automatic calibration this arrangement requires that the two test ports 1, 2 are directly linked by a through-connection T. The switching states of the calibration network are transformed to the test port plane. The basic state of the calibration network represents a through-connection in the test port plane.

$$E_0 \rightarrow N = \begin{pmatrix} 1 & 0 \\ 0 & 1 \end{pmatrix} \tag{1}$$

For the two other states there holds the relationship calibration network test port plane $$E_0 E_1 \rightarrow \tilde{E}_1$$
$$E_0 E_2 \rightarrow \tilde{E}_2 \tag{2}$$

Figure 4:
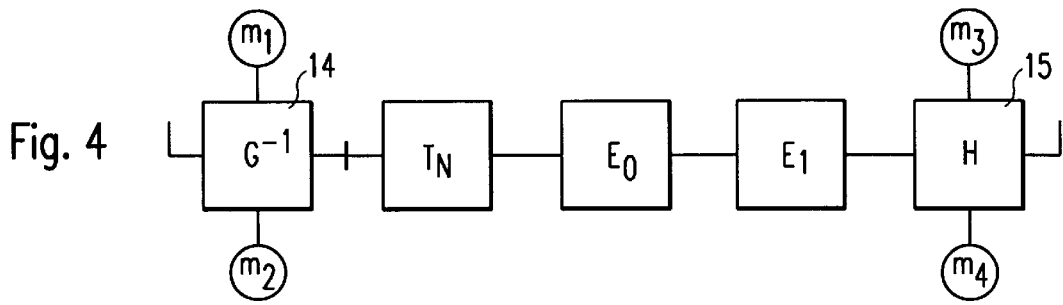
FIG. 4 is a block diagram illustrating a state other than the basic state of the FIG. 3 network analyzers.
Figure 5:
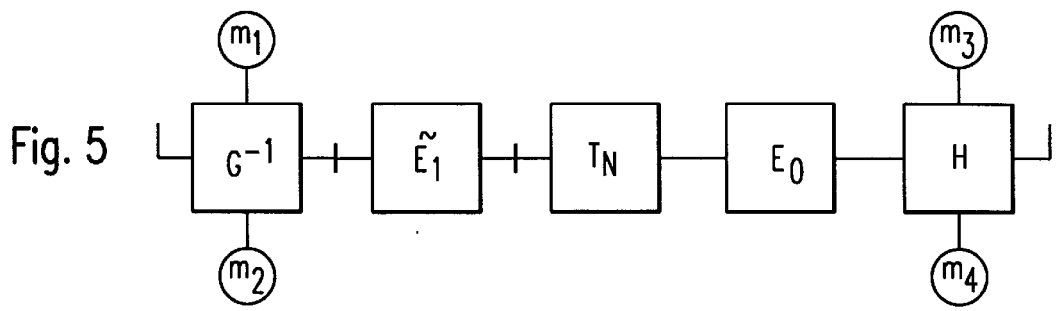
FIG. 5 is a block diagram corresponding to the FIG. 4 block diagram.

Hence the requirement that the series circuit illustrated in FIG. 4 must correspond to the representation of FIG. 5. Algebraically, this means:

$$G^{-1} T_N E_0 E_1 H = G^{-1} \tilde{E}_1 T_N E_0 H \tag{3}$$

$$T_N E_0 E_1 = \tilde{E}_1 T_N E_0 \tag{4}$$

$$\Rightarrow \tilde{E}_1 = T_N E_0 E_1 (T_N E_0)^{-1}. \tag{5}$$

Hence, $E_1$ may be mapped onto $\tilde{E}_1$ by means of a similarity transformation. The transformation equation (5) emphasizes the technical requirement to the calibration network 20 and the transformation network 21. When $E_0$ and $E_1$ have been determined, the transformation can be used for calibration only while $T_N$, $E_0$ and $E_1$ are not changed.

Basic Calibration

The network analyzer may be calibrated with the automatically controlled calibration network 20 provided the calibration network standards are known. These standards may be determined, for instance, by means of TMS or TMR calibration. To this end TMS must be performed in each one of the three states of the calibration network. In the basic state of the calibration network there holds $$M1 = G^{-1} N\, T_N E_0 H. \tag{6}$$

TMS then leads to the calculation of $$G^{-1} \text{ and } H' = T_N E_0 H. \tag{7}$$

The same holds for the first switching state $$M2 = G^{-1} N\, T_N E_0 E_1 H, \tag{8}$$

so that $$G^{-1} \text{ and } H'' = T_N E_0 E_1 H, \tag{9}$$

follows from TMS. The second switching state leads to $$M3 = G^{-1} N T_N E_0 E_2 H. \tag{10}$$

$$TMS: \Rightarrow G^{-1} \text{ und } H''' = T_N E_0 E_2 H \tag{11}$$

Hence, the four error twoports G, H', H" and H'" result from the basic calibration. With these data the virtual calibration network standards $\tilde{E}_1$ and $\tilde{E}_2$ must be calculated.

$$H'' = T_N E_0 E_1 H \tag{12}$$

with the aid of the transformation equation (5) becomes $$H'' = \tilde{E}_1 T_N E_0 H = \tilde{E}_1 H', \tag{13}$$

and hence $$\tilde{E}_1 = H'' H'^{-1}. \tag{14}$$

For the second switching state there holds analogously $$H''' = T_N E_0 E_2 H \rightarrow H''' = \tilde{E}_2 T_N E_0 H = \tilde{E}_2 H', \tag{15}$$

$$\Rightarrow \tilde{E}_2 = H''' H'^{-1}. \tag{16}$$

The calculation of $\tilde{E}_1$ and $\tilde{E}_2$ completes the basic calibration. For practical use the matrices must be determined for every possible frequency point and stored in the network analyzer. As mentioned above, calibration networks may be realized with high reproducibility so that they maintain their properties over a prolonged period. For this reason the period between two basic calibrations is very long, it will be several months for practical purposes.

Transfer or User Calibration

For transfer calibration the user first has to link the test ports so that a through-connection is formed. Thereafter the calibration network is measured in its three switching states under control by the analyzer.

1)
$$M1 = G^{-1} K\, H$$

2)
$$M2 = G^{-1} \tilde{E}_1 K\, H \tag{17}$$

3)
$$M3 = G^{-1} \tilde{E}_2 K\, H$$

in which $K = T_N E_0$.

Proceeding from the error twoport descriptions $$\begin{pmatrix} b_1 \\ a_1 \end{pmatrix} = \begin{pmatrix} G_{11} & G_{12} \\ G_{21} & G_{22} \end{pmatrix} \begin{pmatrix} m_1 \\ m_2 \end{pmatrix} \text{ and} \tag{18}$$

$$\begin{pmatrix} a_2 \\ b_2 \end{pmatrix} = \begin{pmatrix} H'_{11} & H'_{12} \\ 1 & H'_{22} \end{pmatrix} \begin{pmatrix} m_3 \\ m_4 \end{pmatrix}$$

and the combination of the waves applied to a DUT by means of scattering parameters $$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix}, \tag{19}$$

one may by elimination of the wave values $(a_i, b_i)$ in (19) with the aid of the discrete matrix equations from (18) find the following relationship $$\begin{pmatrix} G_{11} m_1 + G_{12} m_2 & G_{11} m'_1 + G_{12} m'_2 \\ m_3 + H'_{22} m_4 & m'_3 + H'_{22} m'_4 \end{pmatrix} = \tag{20}$$

$$S \begin{pmatrix} G_{21} m_1 + G_{22} m_2 & G_{21} m'_1 + G_{22} m'_2 \\ H'_{11} m_3 + H'_{12} m_4 & H'_{11} m'_3 + H'_{12} m'_4 \end{pmatrix}$$

Transformation results in the set of equations (1):
$$G_{11}m_1+G_{12}m_2-G_{21}S_{11}m_1-G_{22}S_{11}m_2-H'_{11}S_{12}m_3-H'_{12}S_{12}m_4=0,$$

(2):
$$G_{11}m'_1+G_{12}m'_2-G_{21}S_{11}m'_1-G_{22}S_{11}m'_2-H'_{11}S_{12}m'_3-H'_{12}S_{12}m'_4=0,$$

(3):
$$-G_{21}S_{21}m_1-G_{22}S_{21}m_2-H'_{11}S_{22}m_3-H'_{12}S_{22}m_4+H'_{22}m_4=-m_3,$$

(4):
$$-G_{21}S_{21}m'_1-G_{22}S_{21}m'_2-H'_{11}S_{22}m'_3-H'_{12}S_{22}m'_4+H'_{22}m'_4=-m'_3. \quad (21)$$

Describing the virtual calibration network standards by scattering parameters, one obtains four equations from every discrete calibration network position for determining the seven unknown error matrix elements. However, only seven equations are required for determining the G- and H'-matrix elements. This redundancy may be used for a calculus of observations.

The calculus of observations, which corresponds to the least square method, is based on equation (21). For the first equation from (21) there holds $$(m_1m_2-S_{11}m_1-S_{11}m_2-S_{12}m_3-S_{12}m_40)\underline{V}=0 \;\; bzw. \;\; \underline{X}_1^T\underline{V}=y_1 \quad (22)$$

wherein $$\underline{V}=(G_{11}G_{12}G_{21}G_{22}H'_{11}H'_{12}H'_{22})^T.$$

The addition of an error $z_1$ to (22) results in $$y_1=\underline{X}_1^T\underline{V}+z_1.$$

Hence we obtain for all twelve equations $$y_i = \sum_{l=1}^{12} V_l X_{il} + z_i \quad (i = 1\ldots12). \quad (23)$$

By $$\underline{y} = (y_1, \ldots, y_{12})^T \text{ and } X = (X_{il})_{i=1,\ldots,12;l=1,\ldots,7}$$

we obtain by the least square method the solution vector:

$$\underline{V}=(X^TX)^{-1} X^T\underline{y} \quad (24)$$

Figure 6:
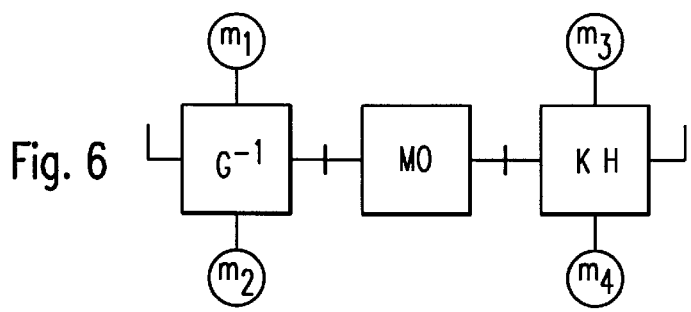
FIG. 6 is a block diagram depicting error correction when measuring an unknown object.

This solution vector allows calculation of the error twoports $$G \text{ and } H'=K\,H \quad (25)$$

by means of which an error correction may be effected when measuring an unknown object to be measured. When measuring an unknown object to be measured according to FIG. 6, the calibration network is in its basic state.

Semi-Automatic Calibration Method With Two Calibration Networks

Figure 7:
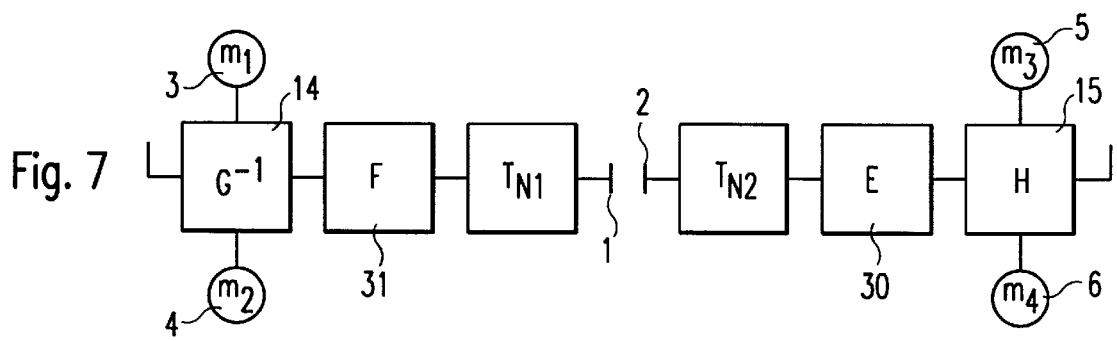
FIG. 7 is a block diagram depicting distributed error correction.

The calibration network 20 for performing the semi-automatic system error correction need not necessarily be inserted on a given side of the network analyzer. Moreover, it may also be implemented when distributed to both sides (FIG. 7). Then, the analyzer has a calibration network 30 and 31 at each test port, respectively. The calibration networks which are described by the two transmission matrices E and F will each have to realize only one circuit variation which deviates from the basic state.

Analogously to the procedure in the description of the system error correction with only a single calibration network, the arrangement according to FIG. 7 results in two transformation equations. For the first calibration network in its switch position other than the basic state there holds $$G^{-1}F_0F_1T_{N1}T_{N2}E_0H=G^{-1}F_0T_{N1}\tilde{F}_1T_{N2}E_0H, \quad (26)$$

so that the transformation equation $$\tilde{F}_1=T_{N1}^{-1}F_1T_{N1} \quad (27)$$

will hold. The second calibration network leads to $$G^{-1}F_0T_{N1}T_{N2}E_0E_1H=G^{-1}F_0T_{N1}\tilde{E}_1T_{N2}E_0H \quad (28)$$

and, respectively $$\tilde{E}_1=T_{N2}E_0E_1(T_{N2}E_0)^{-1} \quad (29)$$

Basic Calibration

From the TMS calibration there result for all three switching states the following equations:

a) Basic state $$G'^{-1}=G^{-1}F_0T_{N1}$$

$$H'=T_{N2}E_0H \quad (30)$$

b) 1st switch position $$G''^{-1}=G^{-1}F_0F_1T_{N1}$$

$$H''=T_{N2}E_0H \quad (31)$$

c) 2nd switch position $$G'''^{-1}=G^{-1}F_0T_{N1}$$

$$H'''=T_{N2}E_0E_1H \quad (32)$$

Substituting $F_1$ from (31) by the transformation equation (27) one obtains $$G''^{-1} = G^{-1}F_0T_{NI}\tilde{F}_1 \quad (33)$$

$$\Rightarrow \tilde{F}_1 = G'G''^{-1} \quad (34)$$

Correspondingly, there holds for the 2nd switch position in conjunction with equation (29):

$$H''' = \tilde{E}_1T_{N2}E_0H \quad (35)$$

$$\Rightarrow \tilde{E}_1 = H'''H'^{-1} \quad (36)$$

Transfer or User Calibration

Figure 8:
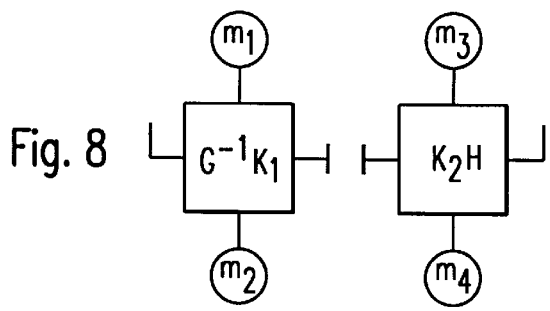
FIG. 8 is a block diagram depicting an extended calibration network of the basic state of the network analyzer.

When the two test ports of the analyzer are interconnected, measurement of the three calibration line positions results in the basic state of the network analyzer extended by the calibration network (FIG. 8), said basic state being required for system error correction.

1) $M1 = G^{-1}K_1K_2H$ (37)

2) $M2 = G^{-1}K_1\tilde{E}_1K_2H$

3) $M3 = G^{-1}K_1\tilde{F}_1K_2H$ $\Rightarrow G'^{-1} = G^{-1}K_1$ and $H' = K_2H$ (38)

wherein $K_1 = F_0 T_{N1}$ and $K_2 = T_{N2} E_0$.

Semi-Automatic Calibration Without Exact Through-Connection

The requirement for a through-connection (T) which is as precise as possible between the test ports during transfer calibration may be considered as a drawback of the methods documented so far. In contrast thereto, the method explained below requires merely an unknown connection $N_X$ of the two test ports which exhibits transmitting character and is reciprocal as a twoport.

Figure 9:
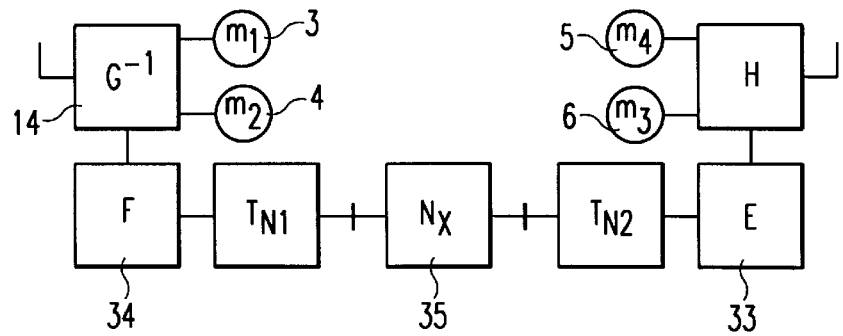
FIG. 9 is a block diagram depicting the use of two calibration networks.

The method requires two calibration networks 33 and 34 instead of one network, each having two different switching states other than the basic state. The two calibration networks are arranged as illustrated in FIG. 9 on either side of the network analyzer. Inbetween the two test ports 1 and 2 an unknown reciprocal object 35 is connected which is described by the unknown transmission matrix $N_X$. In this case, basic and transfer calibration require some increased mathematical efforts but do not make any additional demands on the user.

Basic Calibration

The basic calibration is again based on the use of a common calibration method such as TMS, i.e. the exact through-connection is still required. The calibration must be performed for both calibration networks. Upon completion of the method—analogously with the procedure for the basic model of the semi-automatic calibration—the virtual calibration network standards $\tilde{F}_1$, $\tilde{F}_2$, $\tilde{E}_1$ and $\tilde{E}_2$ will be known.

Transfer and User Calibration

The transfer calibration also must be performed twice with both calibration networks, in which case the test port connection is now described by $N_X$. In practice this means that, for instance, an unknown line is inserted between the test ports or that the test ports are fastened only slightly to each other whereby cross-talk is ensured. By way of the virtual standards $\tilde{F}$ and $\tilde{F}_2$ of the calibration network F the transfer calibration results in two error fourports as follows:

1)

$G^{-1}F_0T_{N1}=G'^{-1}$ (39)

and

2)

$N_XT_{N2}E_0H=N_XH'=H^*$. (40)

Use of the calibration network E results in

1)

$G^{-1}F_0T_{N1}N_X=G'^{-1}N_X=G^{*-1}$ (41)

and

2)

$T_{N2}E_0H=H'$. (42)

The parameters of the error twoports are not fully obtained from the basic calibration, they can only be determined in the form of a reference. The choice of such reference is practically arbitrary and shall be expressed here by the factors $G'_{12}$ or $H'_{21}$. For the error matrices determined with the calibration network F there follows $$\hat{G}^{-1} = G'_{12}G'^{-1} \text{ and } \hat{H} = \frac{1}{G'_{12}}\overset{*}{H} = \frac{1}{G'_{12}}N_xH'. \quad (43)$$

In the first part of the transfer calibration, the choice of an element of the Matrix $H^*$ as a reference value is not suited because in that case the reference would depend on the unknown transmission matrix $N_X$. From the use of the second calibration network E there follows analogously $$\tilde{G}^{-1} = H'_{12}\tilde{G}^{*-1} = H'_{12}G'^{-1}N_x \text{ and } \tilde{H} = \frac{1}{H'_{12}}H', \quad (44)$$

and here, too, a reference independent of $N_X$ has been chosen. From equations (43) and (44) the two expressions $$\hat{H} = \frac{H'_{12}}{G'_{12}}N_x\tilde{H} = \alpha N_x\tilde{H} \text{ and} \quad (45)$$

$$\tilde{G}^{-1} = \frac{H'_{12}}{G'_{12}}\hat{G}^{-1}N_x = \alpha\hat{G}^{-1}N_x \quad (46)$$

may be found with $\alpha = H'_{12}/G'_{12}$. A transformation of equation (45) or (46) leads to the expressions $U = \hat{H}\tilde{H}^{-1} = \alpha N_X$ and $V = \tilde{G}\hat{G}^{-1} = \alpha N_X,$ (47)

from which the matrix $N_X$ is obtained except for the constant factor $\alpha$. To determine $N_X$ it is only required to use an equation resulting from (47). For instance in respect of U there follows, written in the form of an S-parameter:

$$U = \alpha\frac{1}{S_{x21}}\begin{pmatrix} -\Delta S_x & S_{x11} \\ -S_{x22} & 1 \end{pmatrix}, \quad (48)$$

in which $\Delta S_X = S_{X11}S_{X22} - S_{X12}S_{X21}$. By forming the proportion of discrete elements of the matrix U (or V) the factor a can be eliminated so that $$S_{x11} = \frac{U_{12}}{U_{22}}, \quad S_{x22} = -\frac{U_{21}}{U_{22}} \text{ and } \Delta S_x = -\frac{U_{11}}{U_{22}}. \quad (49)$$

Since the twoport $N_X$ is a reciprocal twoport there follows also $$S_{x12} = S_{x21} = \pm\sqrt{S_{x11}S_{x22} - \Delta S_x}, \quad (50)$$

whereby $N_X$ has been determined except for the ambiguity of sign. The correct choice of the sign requires preliminary information about the phase of $S_{X12}$.

Semi-Automatic Calibration Method Without Test Port Connection

Figure 10:
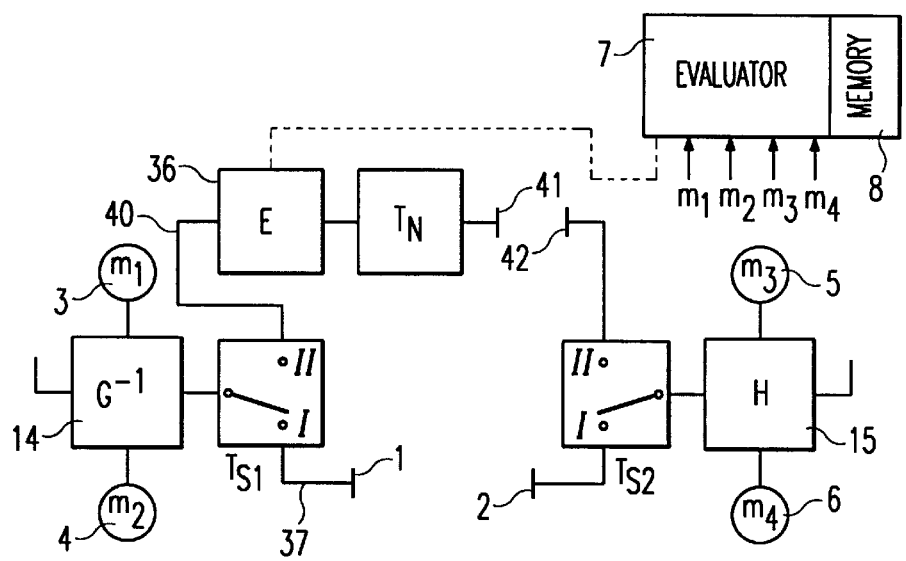
FIG. 10 is a block diagram of a network analyzer of the present invention having a test port branch.

The network analyzer shown in FIG. 10 is again represented by the two error twoports G and H. Moreover, a calibration network 36 is provided which is not, however, inserted in the test port branch 37. The analyzer uses two switches $T_{S1}$ and $T_{S2}$ for switching to and fro between the calibration branch 40 and the test port branch 37. The calibration branch 40 comprises two additional test ports 41 and 42 (system ports) accessible to the user. When the semi-automatic calibration method and subsequent measurement of the DUT is used, these system ports are interconnected permanently.

The switches $T_{S1}$ and $T_{S2}$ which are only required to exhibit long-term stability may be described with respect to their two positions by transmission matrices.

| Switch position | | |
|---|---|---|
| switch $T_{S1}$ | I | → $T^I_{S1}$ |
| | II | → $T^{II}_{S1}$ |
| switch $T_{S2}$ | I | → $T^I_{S2}$ |
| | II | → $T^{II}_{S2}$ |

Basic Calibration

The basic calibration is performed separately for the calibration branch and for the test port branch.

Calibration Branch 40

With an LMS calibration of the above-specified kind the virtual calibration network standards $\hat{E}_1$ and $\hat{E}_2$ as well as the two error twoports $X_1$ and $Y_1$ are determined, which are expressed as:

$$X_1 = G^{-1} T_{S1}^{II} E_0 T_N$$

and $$Y_1 = T_{S2}^{II} H. \tag{51}$$

These four matrices are stored in the memory of the network analyzer for every possible frequency point.

Test Port Branch 37

For example, a TMS calibration is used to determine the error twoports $$X_2 = G^{-1} T_{S1}^{I}$$

and $$Y_2 = T_{S2}^{I} H. \tag{52}$$

Moreover, the reflection factor $\Gamma_i$ (i=1,2) is measured at the end of the two open test port leads. For the first test port, $\Gamma_i = \Gamma_1$ and for the second test port, $\Gamma_i = \Gamma_2$. These data are also stored for every frequency point. Subsequent to the basic calibration, the system ports 41, 42 must be permanently connected to the line L known from the LMS calibration.

Transfer or User Calibration

For a better explanation of the transfer calibration we shall assume that the network analyzer subsequent to the basic calibration has changed as to its electrical characteristics. Hence, the error twoports G and H have also changed.

$$G_{neu} = G \Delta G$$

$$H_{neu} = H \Delta H \tag{53}$$

The changes of the error twoports as compared to their state during basic calibration are represented by the matrices $\Delta G$ and $\Delta H$.

When the switches $T_{S1}$ and $T_{S2}$ have adopted their respective switching positions II, the error twoport matrices $$X'_1 = G_{neu}^{-1} T_{S1}^{II} E_0 T_N$$

and $$Y'_1 = T_{S2}^{II} H_{neu} \tag{54}$$

will be obtained by the automatic calibration network calibration.

There follows with equation (53):

$$X'_1 = \Delta G^{-1} G^{-1} T_{S1}^{II} E_0 T_N = \Delta G^{-1} X_1 \tag{55}$$

and $$Y'_1 = T_{S2}^{II} H \Delta H = Y_1 \Delta H. \tag{56}$$

Since the matrices $X_1$ and $Y_1$ were determined and stored during basic calibration, the changes of the analyzer setup may be calculated.

$$\Delta G = X_1 X'^{-1}_1,$$

$$\Delta H = Y_1^{-1} Y'_1 \tag{57}$$

Assuming that the switches $T_{S1}$ and $T_{S2}$ switch in a reproducible way and have not changed, there holds in switch position I for the two unknown error twoports of the test port branches $$X'_2 = G_{neu}^{-1} T_{S1}^{I} = \Delta G^{-1} X_2 \tag{58}$$

$$Y'_2 = T_{S2}^{I} H_{neu} = Y_2 \Delta H. \tag{59}$$

The above considerations have exclusively served to determine the error twoports of the network analyzer (behind the switches). Any changes of the test port leads have not been taken into account. The changes in the leads will be discussed below with reference to the test port 1, and they hold analogously for the test port 2.

Figure 11A:
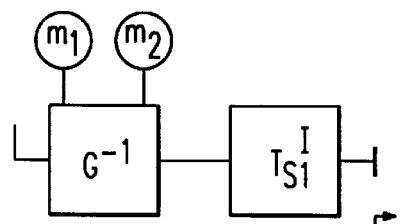
FIG. 11a is a block diagram depicting measurement of a reflection factor.
Figure 11B:
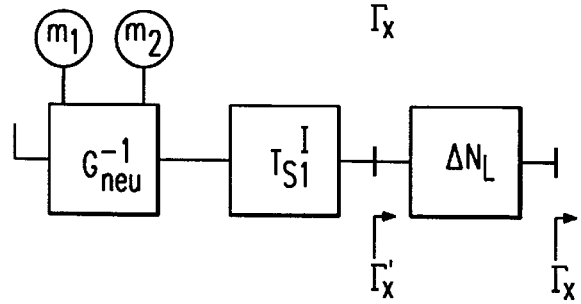
FIG. 11b is a block diagram depicting a reflectometer in its measuring mode.

At the completion of the basic calibration the reflection factor $\Gamma_1$ of the open test port lead was measured (FIG. 11a). The test port lead shall substantially be characterized by changes in the electrical length and the attenuation, changes of the input reflection factor at the lead end shall be neglected. Under these prerequisites, the reflectometer in its measuring mode may be described as illustrated in FIG. 11b.

$\Delta N_L$ 19 represents the change of the transmission matrix of the feeder cable. Since a change in reflection is to be zero and a change in transmission is reciprocal, there holds $$\Delta N_L = \begin{pmatrix} \Delta S_{12} & 0 \\ 0 & \dfrac{1}{\Delta S_{12}} \end{pmatrix}. \tag{60}$$

As the matrix $X'_2 = G^{-1}_{neu} T'_{S1}$ is obtained from the transfer calibration, a reflection factor $\Gamma'_x$ is measured which is in a reference plane that does not correspond to so the test port plane. However, from the basic calibration the exact reflection factor $\Gamma_x$ of the test port is known so that $$\Gamma'_x = \frac{\Delta N_{L11} \Gamma_x + \Delta N_{L12}}{\Delta N_{L21} \Gamma_x + \Delta N_{L22}} \tag{61}$$

$$= \Delta S_{12}^2 \Gamma_x$$

$$\Rightarrow \Delta S_{12} = \pm \sqrt{\frac{\Gamma'_x}{\Gamma_x}} \tag{62}$$

Hence, there follows for the desired phase change due to a change in the electrical line length $$\Delta \varphi = \frac{\mathrm{arc}(\Delta S_{12}^2)}{2} \tag{63}$$

and for the attenuation $$|\Delta S_{12}| = \sqrt{\frac{\Gamma_x'}{\Gamma_x}} \tag{64}$$

Semi-Automatic Reflectometer Calibration

FIG. 12 shows the use of the invention with a reflectometer. A reflectometer has only one test port 60 which is connected to a fourport 61 having two test points 62, 63, said fourport being configured as a bridge or directional coupler. This commonly known reflectometer is supplemented, as illustrated in FIG. 12, by a changeover switch 64 and a calibration twoport 65 adapted to be changed over between three different transmission and/or reflection states under control of the evaluation means 66 which is connected with a memory 67 for storing system errors that have been determined during a calibration operating and must be taken into account when measuring the object. In switch position I, the test port 60 is connected via the changeover switch 64 through the calibration test port 65 to the measuring points 62, 63, while in switch position II the measuring points are connected via the calibration twoport 65 with a system port 48.

Basic Calibration

In the first step the calibration network 65 is in its basic state. A reflectometer calibration with known standards, which is performed in switch position I at the test port 60 and in switch position II at the system port 68 will lead to the two error twoport matrices $Y_1$ and $Y_2$ each of which comprises the three error parameters required for characterizing the reflectometer (the fourth matrix element is unity).

$$Y_1 = T_S' E_0 H$$

and $$Y_2 = T_S'' E_0 H \tag{65}$$

$Y_1$ and $Y_2$ are determined for every possible frequency point and stored in the network analyzer.

The second step of the basic calibration resides in the objective of determining the reflection standards virtually generated by the calibration network in the plane of the test port. The switch 64 is in position II, and the system port is permanently terminated with a reflection-free termination (Match). The standards generated by the calibration network are transformed into the plane of the system port, i.e. between the output of the switch and the match. Hence, there result in said plane the reflection factors according to FIG. 13 for all three calibration line positions as follows:

$$\Gamma_1 = \Gamma_m = 0 \tag{66}$$

$$\Gamma_2 = \frac{\tilde{E}_{111}\Gamma_m - \tilde{E}_{121}}{\tilde{E}_{122} - \tilde{E}_{111}\Gamma_m} = -\frac{\tilde{E}_{121}}{\tilde{E}_{122}}$$

$$\Gamma_3 = \frac{\tilde{E}_{211}\Gamma_m - \tilde{E}_{221}}{\tilde{E}_{222} + \tilde{E}_{211}\Gamma_m} = -\frac{\tilde{E}_{221}}{\tilde{E}_{222}}$$

$\tilde{E}_1$ and $\tilde{E}_2$ are the virtual calibration network standards in the test port plane. As the error parameters of the reflectometer are known through $Y_2$, the reflection standards $\Gamma_1$, $\Gamma_2$ and $\Gamma_3$ can be determined and stored in the memory 67. Assuming that the calibration network 65 and the switch 64 are stable over prolonged periods, which is a reality in practice, it is only the error twoport H which will change with time, $H_{neu} = H\Delta H$.

Transfer or User Calibration

During transfer calibration the switch 64 is in position II. The system port is terminated by a match. From an automatic reflectometer calibration with the three virtual reflection factors there results the error twoport matrix $Y'_2$.

$$Y'_2 = T_S^{II} E H_{neu} = T_S^{II} E H \Delta H = Y_2 \Delta H \tag{67}$$

$$\Rightarrow \Delta H = Y_2^{-1} Y'_2 \tag{68}$$

When the switch is moved to position I, the error twoport for the test port arrangement should be calculated as $$Y'_1 = T_S' E H_{neu} = T_S' E H \Delta H = Y_1 \Delta H = Y_1 Y_2^{-1} Y'_2 \tag{69}$$

whereby calibration is completed.

Calibration With Transmissionless Calibration Network Standards

Up to now, the system error correction methods for the calibration of dual reflectometers were based on the fact that the calibration networks had to exhibit transmission in any switching state. In order to allow also for transmissionless states of the calibration network (e.g. short-circuit), the calibration mathematics must no longer be formulated with transmission matrices because these are singular for transmissionless twoports.

Below, the mathematics of the semi-automatic calibration method for all possible calibration network standards will be explained with reference to the basic model (FIG. 3). However, it may be extended to all other analyzer setups.

Basic Calibration

Starting out from the error twoport description (FIG. 2)

$$\begin{pmatrix} b_1 \\ a_1 \end{pmatrix} = G \begin{pmatrix} m_1 \\ m_2 \end{pmatrix} \quad \text{and} \quad \begin{pmatrix} a_2 \\ b_2 \end{pmatrix} = H' \begin{pmatrix} m_3 \\ m_4 \end{pmatrix} \tag{70}$$

and the combination of the waves applied to the DUT by means of scattering parameters $$\begin{pmatrix} b_1 \\ b_2 \end{pmatrix} = S \begin{pmatrix} a_1 \\ a_2 \end{pmatrix} \tag{71}$$

it is possible by elimination of the wave values ($a_i$, $b_i$) to find by means of the discrete matrix equations the following connection:

$$S = \begin{pmatrix} G_{11}m_1 + G_{12}m_2 & G_{11}m'_1 + G_{12}m'_2 \\ H'_{21}m_3 + H'_{22}m_4 & H'_{21}m'_3 + H'_{22}m'_4 \end{pmatrix} \tag{72}$$

$$\begin{pmatrix} G_{21}m_1 + G_{22}m_2 & G_{21}m'_1 + G_{22}m'_2 \\ H'_{11}m_3 + H'_{12}m_4 & H'_{11}m'_3 + H'_{12}m'_4 \end{pmatrix}^{-1}$$

The values $m_i$ correspond to the measured values of the network analyzer when the test set switch 10 is in position I, and the values $m'_i$ correspond to the measured values for switch position II.

As in the previously described reflectometer calibration, the basic calibration is divided in two basically different method steps. Initially, in the basic mode of the calibration network for instance a TMS calibration is performed at the test ports of the network analyzer. Hence there result the two error twoport matrices $$G^{-1} \text{ and } H'=T_N E_0 H. \tag{73}$$

This procedure is no longer performed for all three positions of the calibration network but is limited to the basic state.

With the error twoports of the basic state G and H' it is possible by means of equation (72) to determined the scattering matrix of a DUT. The virtual calibration network standards may be determined correspondingly. To this end the test ports must be connected. Measuring the calibration network in its first switch position and evaluating the measured values by means of equation (72) will lead to the scattering matrix of a DUT which is virtually disposed intermediate the two test ports. The procedure is analogous for the second position of the calibration network. Now, the virtual calibration network standards $\tilde{S}_1$ and $\tilde{S}_2$ are known and may be stored.

Transfer Or User Calibration

During transfer calibration the test ports are interconnected, and the calibration network is measured in its three switching states. Mathematically, this is similar to the measuring of a through-connection (T) and two known standards which are represented by the matrices $\tilde{S}_1$ and $\tilde{S}_2$.

virtual standard in switch position 1: T virtual standard in switch position 2: $\tilde{S}_1$ virtual standard in switch position 3: $\tilde{S}_2$ From these three measurements the error twoports G and H' can be calculated.

Practical embodiment Of The Calibration Network

The calibration network (calibration twoport) necessary for performing the automatic transfer calibration must realize one of two different switching states other than the basic state. This may be achieved either with a single network or the two switching states are divided to two units. The networks have the task of automatically generating the calibration standards required for calibration and virtually to set these standards between the test ports of the network analyzer. It is not required that these should be precision standards but they may be simple resistance means which need not satisfy any exact prerequisites. Such resistive circuit arrangements are merely required to have long-term stability, which demand is satisfied in practice.

The states realized by the calibration network must not be chosen arbitrarily because under certain circumstances calibration might not be possible. For example, an arrangement according to FIG. 14a comprising two shunt resistors combined with a through-connection T would result in a nonperformable calibration because three conductance arrangements are concerned in this case. This will be shown hereinbelow. Likewise, the combination of two series resistances and the through-connection is not possible, because the through-connection may be considered both as a series impedance of the value 0 and as a conductance element of the value 0.

Measuring of a DUT can be represented algebraically by the series connection of the error fourport $G^{-1}$, the transmission matrix N of the DUT and the error twoport H, the result being equal to the measured value matrix M.

$$M = G^{-1} N H \tag{74}$$

Hence, the measuring of three calibration standards will lead to $$M_1 = G^{-1} N1 H \tag{75}$$

$$M_2 = G^{-1} N2 H \tag{76}$$

$$M_3 = G^{-1} N3 H \tag{77}$$

From the measurement of an unknown DUT there results $$M_4 = G^{-1} N_{MO} H \text{ with } N_{MO} = \begin{pmatrix} N_{11} & N_{12} \\ N_{21} & N_{22} \end{pmatrix} \tag{78}$$

The elimination of the matrix B in equation (78) by means of equation (75) will lead to $$M_4 M_1^{-1} = G^{-1} N_{MO} N1^{-1} G \tag{79}$$

As this equation is a similarity transformation, there holds $$\text{trace}(M_4 M_1^{-1}) = \text{trace}(N_{MO} N1^{-1}) \tag{80}$$

whence $$\xi = N_{11} N1_{22} - N_{12} N1_{21} - N_{21} N1_{12} + N_{22} N1_{11} \tag{81}$$

in which $\zeta = \text{trace}(M_4 M_1^{-1})$. Written as a vector:

$$\xi \text{hu } 1 = (N1_{22} \; -N1_{21} \; -N1_{12} \; N1_{11}) \underline{V} \tag{82}$$

where $\underline{V} = (N_{11} \; N_{12} \; N_{21} \; N_{22})^T$. Assuming that the first calibration standard is a through-connection, $\zeta_1 = (1 \; 0 \; 0 \; 1) \underline{V}$. Accordingly, combining the equations (76) and (77) with (78) one obtains $$\xi = (N2_{22} - N2_{21} - N_{12} N2_{11}) \underline{V} \tag{83}$$

$$\xi = (N3_{22} - N3_{21} - N3_{12} N3_{11}) \underline{V}. \tag{84}$$

A combination of equations (76) and (77)

$$M_2 M_3^{-1} = G^{-1} N2 N3^{-1} H \tag{85}$$

and subsequent multiplication with equation (79) leads to a fourth expression for the determination of $\underline{V}$.

$$\xi_4 = (N2_{11} N3_{22} - N2_{12} N3_{21} N2_{21} N3_{22} - N2_{22} N3_{21} N2_{12} N3_{11} - N2_{11} N3_{12} N2_{22} N3_{22} - N2_{11} N3_{12}) \underline{V} \tag{86}$$

Thus, four equations are available to be used for determining the vector $\underline{V}$. They may be combined to an inhomogeneous system of equations $$\underline{L} = P \underline{V} \text{ with } \underline{L} = (\xi_1 \xi_2 \xi_3 \xi_4)^T \tag{87}$$

For a proper choice of circuit arrangements and a proper choice of calibration standards, respectively, the determinant of the matrix P must be unequal to zero and the rank of P must be equal to 4. Based on this criterion it may be shown that a circuit arrangement of the kind shown in FIGS. 14a–14c is unsuited for calibration. To this end it would be suitable to use chain parameters for computation. Conversely, an arrangement according to FIG. 15 would always permit calibration provided the resistance values are finite and other than zero.

Figure 18:
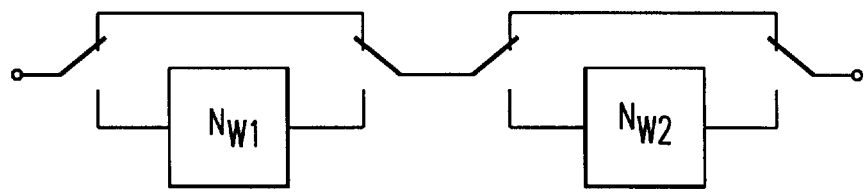
FIG. 18 depicts another switchable calibration network.

For the calibration network to realize a good test port matching, particularly well suited basic circuits are matched attenuator in π- or T-connection as shown in FIGS. 16a or 16b, respectively. FIGS. 17a–17b illustrate the switches S1 and S2 associated with the π-connection, whereby the three switching states shown in FIGS. 17a–17b are realized. The switches S1 and S2 are adapted to be controlled electrically by means of relays. FIG. 18 shows another possible realization for producing two switching states other than the basic state. In the basic state the configuration is a simple connection of the two termination ports. The two circuit variations are effected by insertion of the first and the second network $N_{W1}$, $N_{W2}$, respectively.

The requirement set out in the claims, viz. that the calibration twoport in one of the further switching states differs at least in transmission and in the other of said further switching states differs at least in reflection from the basic switching state, implies for all modifications of the network analyzer of the present invention the possibility that the calibration twoport in the two further switching states differs from the basic state only as to reflection, because a difference in reflection necessarily also means a difference in transmission relative to the basic state, so that this case also satisfies the requirement according to the invention.

Semi-Automatic Calibration Method For Network Analyzers With Three Measuring Points The block diagram of a network analyzer with three test points may be derived from FIG. 1 by making the fourth test point $m_4$ zero in the first switching position of the switch and making the first test point $m'_1$ zero in the second switching position. It will be apparent therefrom that the calibration for both switch positions must be performed separately. If possible, in this method the switch 10 should not include any cross-talk.

The automatic transfer calibration requires a calibration network which realizes two different switching states other than the basic state, and at least one of said two different switching states must exhibit a transmission unequal to zero. The calibration network may be disposed according to FIG. 3 on one side of the network analyzer, or it may be distributed to both sides of the analyzer.

Basic Calibration

Initially, the calibration network is in its basic state, where $\tilde{H}=T_N E_0 H$. From the general mathematical description of the network analyzer $$\begin{pmatrix} b_1 \\ a_1 \end{pmatrix} = \begin{pmatrix} G_{11} & G_{12} \\ G_{21} & G_{22} \end{pmatrix}\begin{pmatrix} m_1 \\ m_2 \end{pmatrix} \quad \text{and} \tag{88}$$

$$\begin{pmatrix} a_2 \\ b_2 \end{pmatrix} = \begin{pmatrix} \tilde{H}_{11} & \tilde{H}_{12} \\ \tilde{H}_{21} & \tilde{H}_{22} \end{pmatrix}\begin{pmatrix} m_3 \\ m_4 \end{pmatrix}$$

for the first switch position with $G_{12}=1$ and $m_4=0$ there follows $$\begin{pmatrix} b_1 \\ a_1 \end{pmatrix} = \begin{pmatrix} G_{11} & 1 \\ G_{21} & G_{22} \end{pmatrix}\begin{pmatrix} m_1 \\ m_2 \end{pmatrix} \quad \text{and} \tag{89}$$

$$\begin{pmatrix} a_2 \\ b_2 \end{pmatrix} = \begin{pmatrix} \tilde{H}_{11}m_3 \\ \tilde{H}_{21}m_3 \end{pmatrix}.$$

Replacing the wave values $a_i$, $b_i$ in $$\begin{pmatrix} b_1 \\ b_2 \end{pmatrix} = \begin{pmatrix} S_{11} & S_{12} \\ S_{21} & S_{22} \end{pmatrix}\begin{pmatrix} a_1 \\ a_2 \end{pmatrix} \tag{90}$$

by means of equation (89), then $$\begin{pmatrix} G_{11}m_1 + m_2 \\ \tilde{H}_{21}m_3 \end{pmatrix} = \begin{pmatrix} S_{11} & S_{12} \\ S_{21} & S_{22} \end{pmatrix}\begin{pmatrix} G_{21}m_1 + G_{22}m_2 \\ \tilde{H}_{11}m_3 \end{pmatrix}. \tag{91}$$

Hence there result the two discrete equations (1):

$$(m_1 - S_{11}m_1 - S_{11}m_2 - S_{12}m_30)\underline{V}_1 = -m_2$$

(2):

$$(0 - S_{21}m_1 - S_{21}m_2 - S_{22}m_3m_3)\underline{V}_1 = 0 \tag{92}$$

in which $\underline{V}_1 = (G_{11}\ G_{21}\ G_{22}\ \tilde{H}_{11}\ \tilde{H}_{21})^T$. The measurement of three completely known calibration standards of which at least two must exhibit a transmission unequal to zero leads with equation (92) to a system of equations which is used for determining the solution vector $\underline{V}_1$.

For the second switch position there holds with $\tilde{H}'_{21}=1$ and $m'_1=0$ $$\begin{pmatrix} b_1 \\ a_1 \end{pmatrix} = \begin{pmatrix} G'_{12}m'_2 \\ G'_{22}m'_2 \end{pmatrix} \quad \text{and} \tag{93}$$

$$\begin{pmatrix} a_2 \\ b_2 \end{pmatrix} = \begin{pmatrix} \tilde{H}'_{11} & \tilde{H}'_{12} \\ 1 & \tilde{H}'_{22} \end{pmatrix}\begin{pmatrix} m'_3 \\ m'_4 \end{pmatrix}$$

In connection with equation (90) there results $$\begin{pmatrix} G'_{12}m'_2 \\ m'_3 + \tilde{H}'_{22}m'_4 \end{pmatrix} = \begin{pmatrix} S_{11} & S_{12} \\ S_{21} & S_{22} \end{pmatrix}\begin{pmatrix} G'_{22}m'_2 \\ \tilde{H}'_{11}m'_3 + \tilde{H}'_{12}m'_4 \end{pmatrix}. \tag{94}$$

with the two discrete equations (1):

$$(m'_2 - S_{11}m'_2 - S_{12}m'_3 - S_{12}m'_40)\underline{V}_2 = 0$$

(2):

$$(0 - S_{21}m'_2 - S_{22}m'_3 - S_{22}m'_4)\underline{V}_2 = -m'_3 \tag{95}$$

in which $\underline{V}_2 = (G'_{12}\ G'_{22}\ \tilde{H}'_{11}\ \tilde{H}'_{12}\ \tilde{H}'_{22})^T$. Measuring of three calibration standards of which at least two must exhibit a transmission unequal to zero leads with equation (95) to a system of equations for the second switch position which system is used for determining the vector $\underline{V}_2$. In general, the elements of the two vectors $\underline{V}_1$ and $\underline{V}_2$ are different so that the basic state of the network analyzer, which has been extended by the circuit arrangement, may be described by a total of ten error parameters.

From the illustrated kind of determining the error parameters there result novel methods for calibrating analyzers with three test points. Measuring of a through-connection T, of a matched load M and of a completely known transmitting network N, whose input reflection factor is unequal to zero, thus leads to TMN calibration. Instead of the termination M it would also be possible to use other known oneports such as, for example, short or open (TSN or TON method). The exchange of the through-connection by a line of known length leads to the LMN method. As compared to the known 10 or 12 term method this represents a simplification because in the known case four fully known standards must be measured of which three do not exhibit transmission. Existing methods which also can do with three standards (TLR*) represent only an approximation.

The object of the basic calibration, among other things, is the determination of the calibration network standards which result virtually in the test port plane. To this end the two vector equations (91) and (94) are combined to a matrix relationship $$\begin{pmatrix} G_{11}m_1 + m_2 & G'_{12}m'_2 \\ \tilde{H}_{21}m_3 & m'_3 + \tilde{H}'_{22}m'_4 \end{pmatrix} = \qquad (96)$$

$$S \begin{pmatrix} G_{21}m_1 + G_{22}m_2 & G'_{22}m'_2 \\ \tilde{H}_{11}m_3 & \tilde{H}'_{11}m'_3 + \tilde{H}'_{12}m'_4 \end{pmatrix}$$

Transformation will lead to $$S = \begin{pmatrix} G_{11}m_1 + m_2 & G'_{12}m'_2 \\ \tilde{H}_{21}m_3 & m'_3 + \tilde{H}'_{22}m'_4 \end{pmatrix} \qquad (97)$$

$$\begin{pmatrix} G_{21}m_1 + G_{22}m_2 & G'_{22}m'_2 \\ \tilde{H}_{11}m_3 & \tilde{H}'_{11}m'_3 + \tilde{H}'_{12}m'_4 \end{pmatrix}^{-1}$$

When the calibration network is measured in its two states other than the basic state, the scattering matrices of the respective calibration network standard (transfer standard) $\tilde{S}_1$, $\tilde{S}_2$ may be computed by means of the equation (97). The computation of the transfer standards may be performed independently of their transmission.

Transfer Or User Calibration

During the transfer calibration the test ports of the network analyzer, which has been extended by the circuit arrangement, are interconnected so that a through-connection results which is as accurate as possible. According to the procedure with four test-point analyzers, the calibration network is also tested in its basic state and in the two states other than the basic state for both switch positions. Mathematically, this is similar to the testing of a through-connection (T) and of two known standards represented by the matrices $\tilde{S}_1$ and $\tilde{S}_2$.

virtual standard in switching position 1: T virtual standard in switching position 2: $\tilde{S}_1$ virtual standard in switching position 3: $\tilde{S}_2$ With these three measurements and the equations (92) and (95) the ten error parameters of the network analyzer may be computed. As already explained, the resulting redundancy in respect of the number of available equations may be used with a calculus of observations.

Semi-Automatic Calibration Method For Unidirectional Network Analyzers

Figure 19:
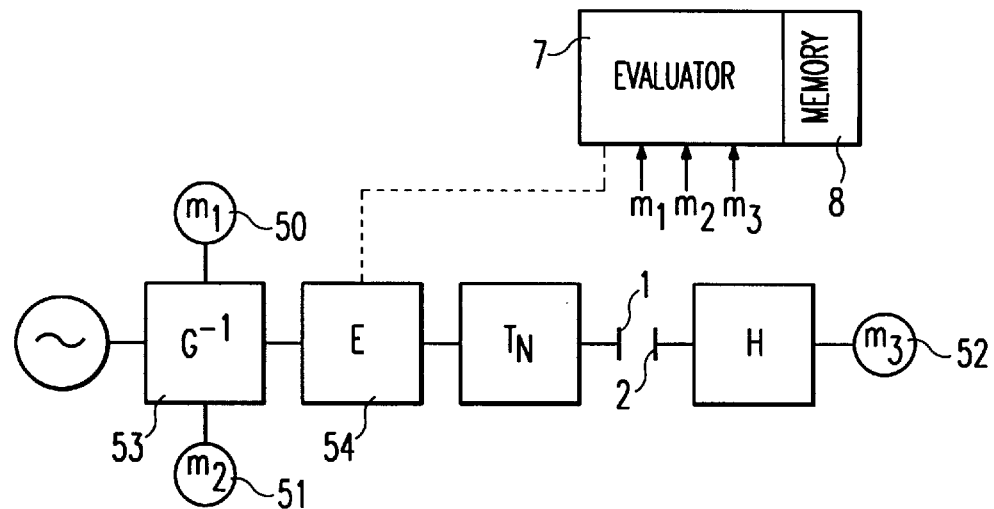
FIG. 19 is a block diagram of a unidirectional network analyzer according to the present invention.

The unidirectional network analyzer is illustrated schematically in FIG. 19. The setup comprises three measuring points 50, 51 and 52 and a reflectometer network 53. A changeover switch 10 as in the case of the bidirectional network analyzer is not provided. A calibration network 54 is disposed between the reflectometer network 53 and a test port 1. With the semi-automatic calibration method for unidirectional network analyzers the calibration network must have two switching states other than the basic state. All states must exhibit transmission other than zero.

Basic Calibration

As with the bidirectional network analyzer, the basic calibration may be performed with three test points, for example by means of the 10-term method or by one of the new calibration methods (e.g. TMN). It is performed for each of the three switching states individually. The determination of the error parameters is now reduced to the determination of five error elements. With $G'^{-1}=G^{-1}E_0T_N$, $H_{21}=1$ and $m_4=0$, there holds $$\begin{pmatrix} b_1 \\ a_1 \end{pmatrix} = \begin{pmatrix} G'_{11} & G'_{12} \\ G'_{21} & G'_{22} \end{pmatrix} \begin{pmatrix} m_1 \\ m_2 \end{pmatrix} \quad \text{and} \quad \begin{pmatrix} a_2 \\ b_2 \end{pmatrix} = \begin{pmatrix} H_{11}m_3 \\ m_3 \end{pmatrix}. \qquad (98)$$

In conjunction with equation (90) there result two equations which are used for determining the error parameters.

(1):

$$(m_1m_2-S_{11}m_1-S_{11}m_2-S_{12}m_3)\underline{V}_1=0$$

(2):

$$(0 \ 0 \ S_{21}m_1 S_{21}m_2 S_{22}m_3)\underline{V}_1=m_3, \qquad (99)$$

in which $\underline{V}_1=(G'_{11} \ G'_{22} \ G'_{21} \ G'_{22} \ H_{11})^T$.

In the first step of the basic calibration, in which the calibration network is in the basic state, for instance the TMN calibration will lead to the matrix G' and to the parameter $H_{11}$.

$$G'^{-1}=G^{-1}E_0T_N \qquad (100)$$

There follows for the first switching state of the calibration network other than the basic state:

$$TMN \Rightarrow G''^{-1} = G^{-1}E_0E_1T_N. \qquad (101)$$

For the third switching state there holds analogously $$TMN \Rightarrow G'''^{-1} = G^{-1}E_0E_2T_N. \qquad (102)$$

The parameter $H_{11}$ remains constant for all switching positions. Taking into account the transformation equation $$E_1=T_N\tilde{E}_1T_N^{-1}, \qquad (103)$$

which combines the change of the calibration network $E_1$ with the change $\tilde{E}_1$ transformed to the test port plane, there result the transmission matrices of the virtual calibration network standards as follows:

$$\tilde{E}_1=G''^{-1}G'$$

and $$\tilde{E}_2=G'''^{-1}G'. \qquad (104)$$

This completes the basic calibration.

Transfer Or User Calibration

During transfer calibration the test ports of the network analyzer extended by the circuit arrangement are interconnected so that a through-connection results which is as exact as possible. The calibration network is tested in its basic state and in the two states other than the basic state. Mathematically, this is similar to the testing of a through-connection (T) and two known standards which are represented by the matrices $\tilde{S}_1$ and $\tilde{S}_2$.

virtual standard in switching position 1: T virtual standard in switching position 2: $\tilde{S}_1$ virtual standard in switching position 3: $\tilde{S}_2$ With these three measurements and the equation (99) the five error parameters of the network analyzer may be computed.

Although we have described our invention by reference to particular illustrative embodiments thereof, many changes and modifications of the invention may become apparent to those skilled in the art without departing from the spirit and scope thereof. We therefore intend to include within the patent warranted hereon all such changes and modifications as may reasonably and properly be included within the scope of our contribution to the art.

What is claimed is:

1. A network analyzer for measuring an object, comprising:
   first and second testports;
   first and second fourports connected to said first and second testports, respectively, each of said first and second fourports having measuring points;
   evaluation means for evaluating measured values of said measuring points of each of said first and second fourports, said evaluation means having a memory for storing system errors that are determined during a calibration operation of said network analyzer, said system errors being taken into account during measurement of said object; and
   a switchable calibration twoport connected between one of said first and second testports and one of said first and second fourports, said switchable calibration twoport being between a basic state for measuring said object, a first further state that deviates from said basic state at least in transmission and a second, further state that deviates from said basic at least in reflection;
   wherein during a user calibration only a single calibration standard, having a transmission other than zero and all scattering parameters of which are known, being connected between said first and second testports, and during measuring an object said object is connected between said first and second testports and the switchable calibration testport is in said basic state.

2. The network analyzer as claimed in claim 1, wherein the network analyzer further comprises means for automatically switching said calibration twoport under control of the evaluation means of the network analyzer.

3. A network analyzer for measuring an object, comprising:
   at least first and second testports connected via at least first and second fourports, respectively, to measuring points;
   evaluation means for evaluating measured values of said measuring points, said evaluation means having a memory for storing system errors that are determined during a calibration operation of said network analyzer, said system errors being taken into account during measurement of said object; and
   at least one switchable calibration twoport that is connected between a respective testport of said first and second testports and a respective fourport of said first and second fourports when said object is connected between said first and second testports, said switchable calibration twoport being switched between a basic state, a further state that deviates from said basic state at least in transmission and a second, further state that deviates from said basic state at least in reflection.

4. A network analyzer for measuring an object, comprising:
   at least first and second testports connected via at least first and second fourports, respectively, to measuring points;
   evaluation means for evaluating measured values of said measuring points, said evaluation means having a memory for storing system errors that are determined during a calibration operation of said network analyzer, said system errors being taken into account during measurement of said object; and
   at least one switchable calibration twoport that is connected between a respective testport of said first and second testports and a respective fourport of said first and second fourports when said object is connected between said first and second testports, said switchable calibration twoport being switched between a basic state and at least one further state that deviates from said basic state at least in transmission,
   wherein, only one switchable calibration twoport is connected between one of said first and second testports and the respective fourport, said switchable calibration twoport being switched between the basic state and two further states, one of said further switching states deviating at least in transmission and the other of said further switching states deviating at least in reflection from the basic switching state.

* * * * *